United States Patent [19]
Needham et al.

[11] Patent Number: 5,570,034
[45] Date of Patent: Oct. 29, 1996

[54] USING HALL EFFECT TO MONITOR CURRENT DURING IDDQ TESTING OF CMOS INTEGRATED CIRCUITS

[75] Inventors: Wayne Needham, Gilbert, Ariz.; Qi-De Qian, Santa Clara; Tim Maloney, Palo Alto, both of Calif.

[73] Assignee: Intel Corporation, Santa Clara, Calif.

[21] Appl. No.: 365,800

[22] Filed: Dec. 29, 1994

[51] Int. Cl.⁶ ............................ G01R 31/28; G01R 33/07
[52] U.S. Cl. ........................ 324/763; 324/117 H; 324/765
[58] Field of Search ........................... 324/117 R, 117 H, 324/763, 765, 769; 257/423, 427

[56] References Cited

U.S. PATENT DOCUMENTS

| | | | |
|---|---|---|---|
| 4,100,563 | 7/1978 | Clark | 257/423 |
| 4,683,429 | 7/1987 | Popovic | 324/252 |
| 4,700,211 | 10/1987 | Popovic et al. | 257/423 |
| 4,710,704 | 12/1987 | Ando | 324/763 |
| 4,893,073 | 1/1990 | McDonald et al. | 324/117 H |
| 4,926,116 | 5/1990 | Talisa | 324/117 H |
| 5,153,557 | 10/1992 | Partin et al. | 338/32 R |
| 5,247,278 | 9/1993 | Pant et al. | 338/32 R |
| 5,392,293 | 2/1995 | Hsue | 324/158.1 |

OTHER PUBLICATIONS

"An Evaluation of IDDQ Versus Conventional Testing for CMOS Sea-of-Gate IC's", K. Sawada and S. Dayano, *ASIC Design Engineering Center, Mitsubishi Electric Corporation*, 1992 IEEE.

"IDDQ Testing Makes a Comeback", Dan Romanchik, *Test & Measurement World*, Oct. 1993, p. 58.

"Built-In Current Testing-Feasibility Study", Wojciech Maly and Phil Nigh, *Department of Electrical and Computer Engineering, Carnegie Mellon University*, 1988 IEEE.

"Master Series IDDQ Product Description-R0.4-Preliminary Jan. 94", *Master Series IDDQ Monitor*, Copyright 1991/1992, LTX Corporation.

"Built-In Current Sensor for IDDQ Test in CMOS", Ching-Wen Hsue and Chih-Jen Lin, *AT&T Bell Laboratories*, 1993 IEEE.

"Circuit Design for Built-In Current Testing", Yukiya Miura and Kozo Kinoshita, *Department of Applied Physics, Osaka University*, 1992 IEEE.

"A General Purpose IDDQ Measurement Circuit", Kenneth M. Wallquist, Alan W. Righter and Charles F. Hawkins, *Electrical & Computer Engineering Department, The University of New Mexico*, 1993 International Test Conference.

"IDDQ and Reliability", Robert C. Aitken, *Design Hechnology Center, Palo Alto, California*, Apr. 26, 1994, Hewlett-Packard.

"IDDQ Background Paper on Sematech/Sandia/UNM Project", Alan Righter & Chuck Hawkins, Apr. 4, 1994, *The University of New Mexico Electrical and Computer Engineering Dept.*

*Primary Examiner*—Ernest F. Karlsen
*Attorney, Agent, or Firm*—Blakely, Sokoloff, Taylor & Zafman

[57] ABSTRACT

A method and an apparatus for sensing quiescent current in a CMOS integrated circuit. The present invention utilizes circuitry which is not series coupled to the CMOS integrated circuit under test. The quiescent current, commonly referred to as $I_{DDQ}$, flows through the supply line during the quiescent state of the CMOS integrated circuit. A magnetic field sensor is located on the substrate near the supply line of the CMOS integrated circuit. The magnetic field sensor detects the magnetic field generated from the supply line by $I_{DDQ}$. The magnetic field sensor is coupled to output circuitry located on the substrate which produces a measurement result calibrated to indicate when $I_{DDQ}$ has a predetermined value.

28 Claims, 6 Drawing Sheets

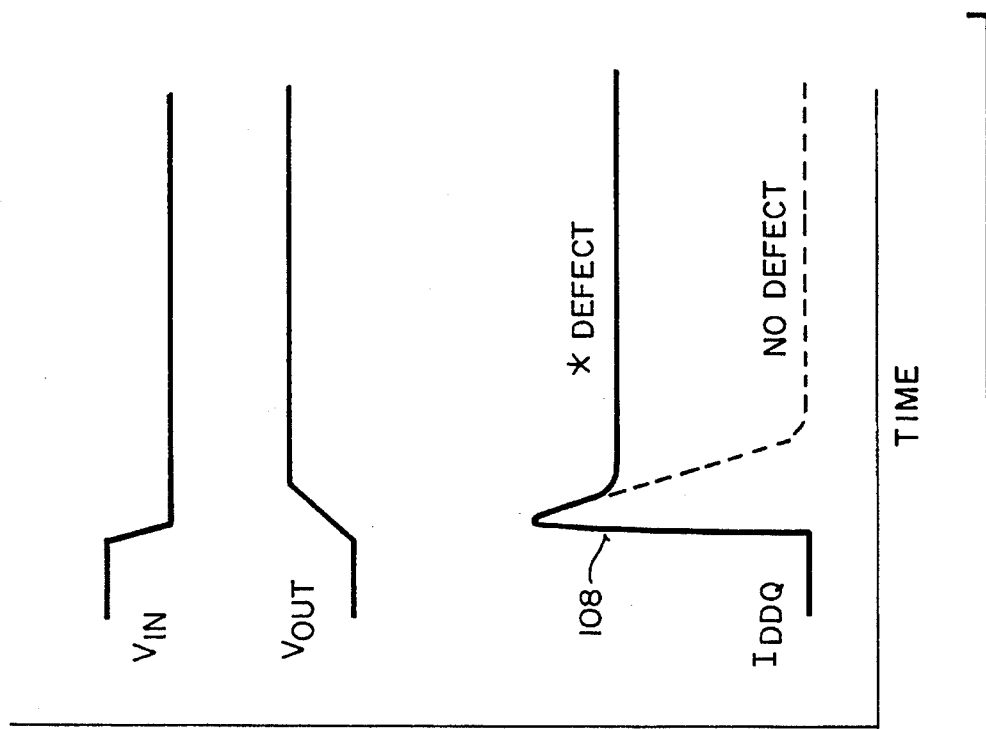
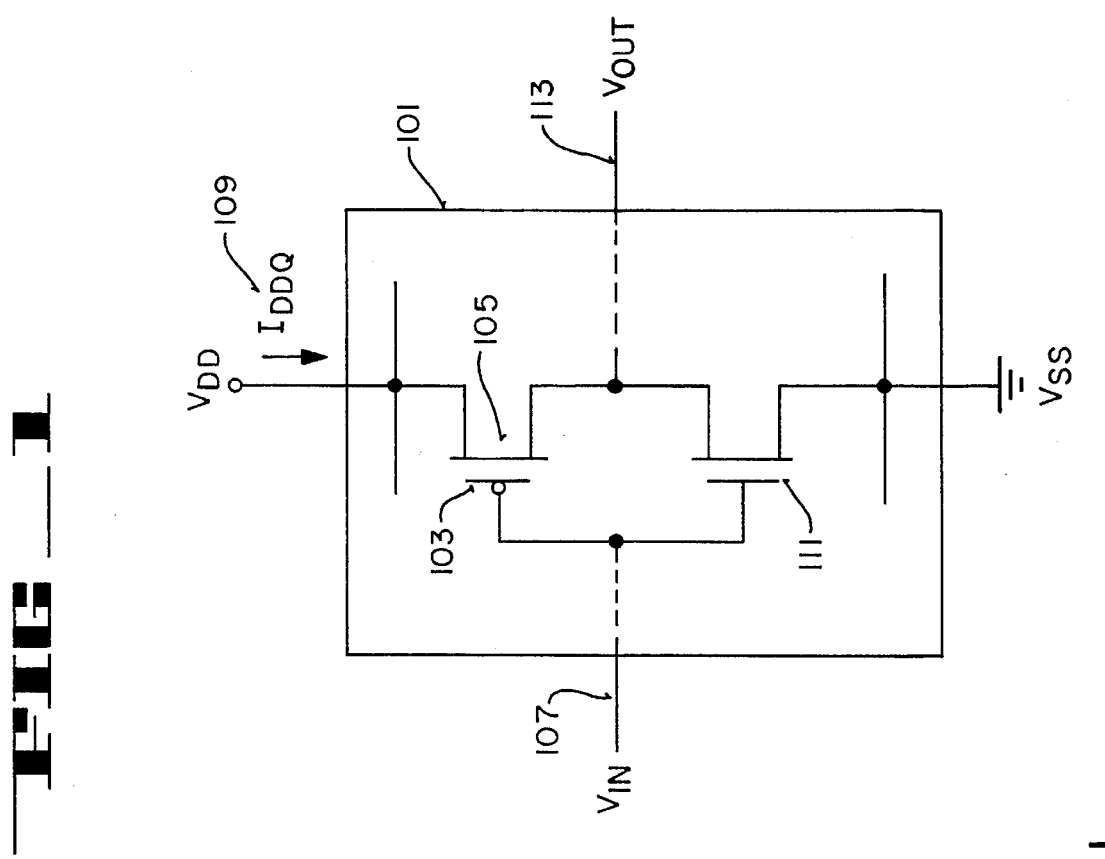
FIG. 1

FIG_3

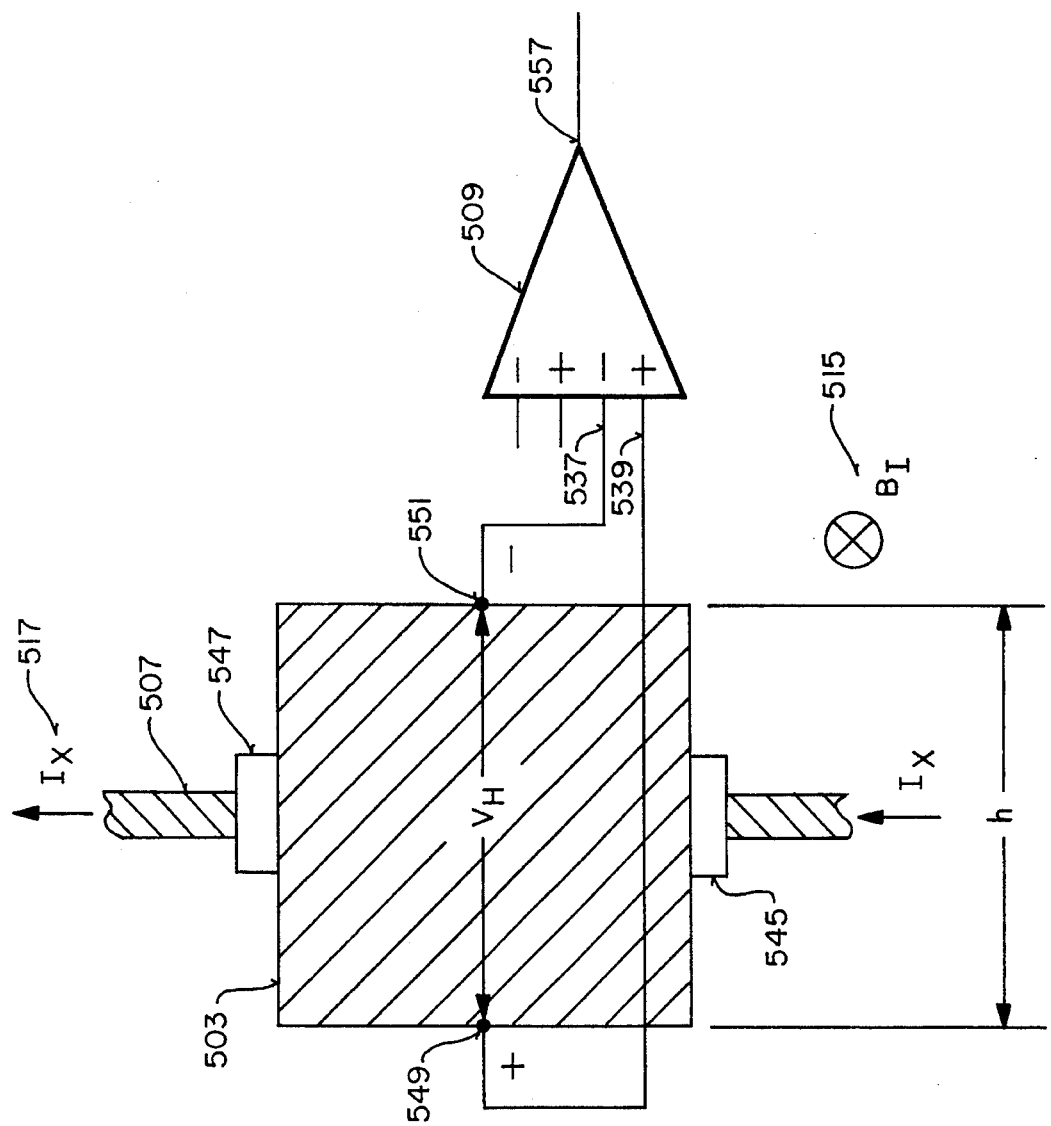
FIG_5

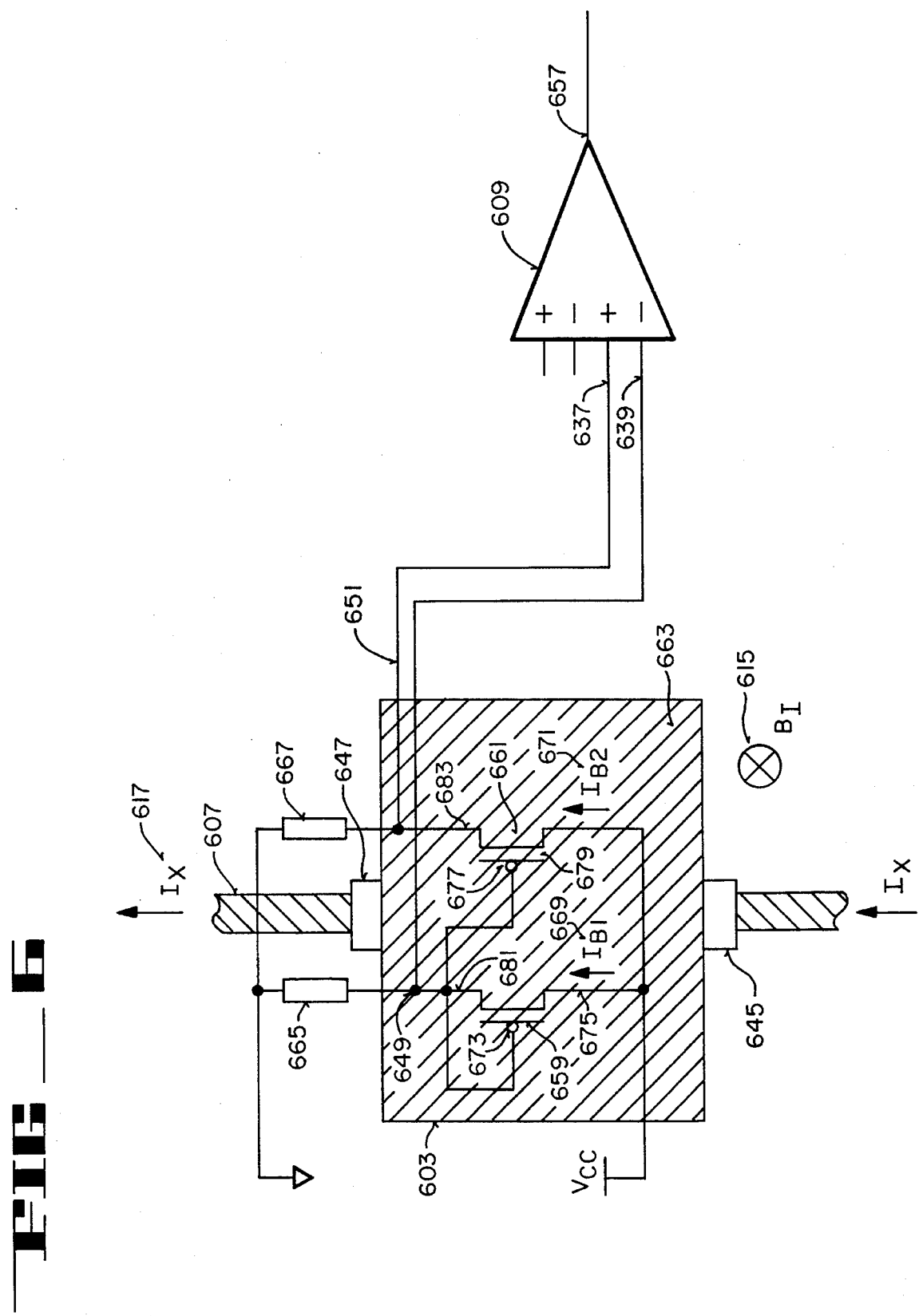

USING HALL EFFECT TO MONITOR CURRENT DURING IDDQ TESTING OF CMOS INTEGRATED CIRCUITS

I. BACKGROUND OF THE INVENTION

A. Field of the Invention

This invention relates to the testing of integrated circuits and, more particularly, to methods and apparatus to test for electric current flowing through CMOS integrated circuits.

B. Description of the Prior Art

1. CMOS Circuit Testing

"Stuck-at" fault testing is a traditional technique used to check for defects in CMOS circuits. This technique generally identifies functional input-output related errors and involves setting a series of input test vectors which should result in a known sequence of output vectors from the device under test (DUT). If a particular output of the circuit is improperly "stuck" at a "0" or "1 ," inconsistent with circuit inputs, a defective circuit can be identified. The stuck-at fault technique originally became popular when bipolar technology testing techniques were established. Testers have continued to use the stuck-at fault model to verify CMOS circuits.

2. $I_{DDQ}$

CMOS integrated circuits are popular for their low power consumption characteristics. If the design is static, the current should be nearly zero in an ideal CMOS circuit during standby or a quiescent state. Thus, when a CMOS circuit is not switching states, only a small amount of current should drawn by the circuit. This quiescent current, commonly referred to as $I_{DDQ}$, is composed primarily of leakage current. $I_{DDQ}$ is the IEEE symbol for the quiescent power supply current in MOS circuits. A faulty CMOS circuit may draw a significantly larger amount of current than a properly functioning CMOS circuit when in the quiescent state.

An abnormally high $I_{DDQ}$ may result from a variety of problems which include defects such as gate-oxide shorts, inter-connect bridging shorts, and inter-connect open circuits. By measuring the $I_{DDQ}$ of a CMOS circuit and comparing it with the $I_{DDQ}$ of a known properly functioning CMOS circuit, a faulty circuit can be detected. FIG. 1 illustrates how a defect, such as a gate-oxide short, can increase the $I_{DDQ}$ of a simple CMOS inverter circuit 101. In FIG. 1, a generalized CMOS integrated circuit has a gate-oxide defect 103 in a p-channel transistor 105. When the input, $V_{IN}$ 107 to the inverter circuit 101 changes from "1" to "0," $I_{DDQ}$ 109 changes from a low value to a high value. Normally, as shown in FIG. 1, $I_{DDQ}$ 108 would drop back to the initial low level once the inverter circuit 101 stabilized. With the gate-oxide defect 103, however, $I_{DDQ}$ 109 Current remains abnormally high.

An interesting point to note is that these types of faults, which result in an abnormally high $I_{DDQ}$, do not necessarily result in a functional circuit failure. Instead, defects often materialize as infant mortality or reliability problems in CMOS circuits. One explanation for the lack of functional failures is that gate-oxide shorts are often high resistance defects which cause only small leakage currents. In addition, CMOS circuits usually have a large noise margin. As a result, small amounts of leakage current may not effect the ultimate output value of the circuit. Since these types of faults to do not always result in functional failures, these defects will not always be identified with traditional stuck-at fault testing.

To detect chips with high resistance caused leakage problems, burn-in is often used as an acceleration technique. Burn-in is a method used to accelerate failures in a device if there is a weak feature or defect that is sensitive to extended operation of the device. Defects such as weak oxides, narrow silicon or metal lines, small resistive contacts, or other similar defects usually become more apparent with burn-in and are therefore more readily identified and may, therefore, fail "stuck at" testing. A tradeoff with burn-in, however, is the substantial time and cost that may be involved depending on the type of device being burned-in.

$I_{DDQ}$ test measurements are used on CMOS circuits as a supplemental technique to identify these defects. To conduct $I_{DDQ}$ current measurements, testers use a variety of techniques. First, off-chip equipment is connected to the CMOS circuits to measure electric current. These methods may include interfacing automated testing equipment (ATE) precision measuring units to the device under test. A problem using these techniques, however, is that test times are slow. Long pauses are often necessary for currents to settle and for the measurement systems to recover from the high switching currents. Depending on some of the capacitance values involved, up to 40 milliseconds may be required to make a single $I_{DDQ}$ measurement. Since thousands of tests may be needed to screen modern VLSI chips effectively, these current measurements may add many seconds to overall test time.

Another off-chip test method used to measure $I_{DDQ}$ involves connecting an external series resistor to the CMOS circuit to monitor the $I_{DDQ}$. By measuring the voltage drop across the resistor between circuit state transitions, $I_{DDQ}$ can be determined. Using this test method, tests may be conducted at rates in the 10's of KHz.

Other off-chip $I_{DDQ}$ measurement techniques include the Keating-Meyer Method proposed by Keating and Meyer in 1987, and the QuiC-Mon method, proposed by Wallquist, Righter, and Hawkins in 1993. For detailed descriptions of these prior art $I_{DDQ}$ measurement methods, see Kenneth M. Wallquist et al., "A General Purpose $I_{DDQ}$ Measurement Circuit," *Proceedings From the International Test Conference* 1993, Baltimore, Md. (1993). Using these techniques, $I_{DDQ}$ measurement rates in the range of 100's of KHz may be achieved.

On-chip $I_{DDQ}$ measurement techniques have also been designed which require providing $I_{DDQ}$ measurement circuitry on the substrate containing the CMOS integrated circuit. By using on-chip techniques, $I_{DDQ}$ tests can be performed without external ATE. Unlike the present invention, all of these on-chip techniques generally involve inserting a series resistance in the power supply line and measuring the voltage drop across the on-chip series resistance to determine $I_{DDQ}$. $I_{DDQ}$ test circuitry is also included on-chip to output a normal logic value when normal $I_{DDQ}$ is measured in the CMOS circuit and a fault condition logic value if $I_{DDQ}$ is abnormally high. For a detailed discussion of prior art on-chip $I_{DDQ}$ measurement techniques, see Miura et al., "Circuit Design for Built-In Current Testing," *Proceedings from the International Test Conference* 1992, IEEE, P.O. Box 1331, Piscataway, NJ 08855, p.873 (1992).

Problems with these on-chip methods result from the series resistance. For a typical integrated circuit, the dynamic range of current, from the high level of switching, to the low level of quiescence, is several orders of magnitude. Circuits designed to give a good sense of level at the low level of current, have a prohibitively high voltage drop during the cycle when the device is switching. This is due to the invasive nature of the series resistor. Thus, considering the added voltage of the resistive connections, on-chip series resistance techniques may be fine for a device having low currents when switching, but are unacceptable for devices having a large number (e.g. millions) of transistors.

Advances in very large scale integrated circuit technology have created additional problems with prior art $I_{DDQ}$ measurement techniques. Normal leakage for many millions of good transistors may reduce the measurement range between a good and bad chip to a point where traditional measurement techniques are not reliable.

Because of the above-described problems with prior art $I_{DDQ}$ measurement techniques, an improved technique is needed to measure $I_{DDQ}$.

II. SUMMARY OF THE INVENTION

A method and an apparatus for sensing the quiescent current flowing through a CMOS integrated circuit is described. The circuitry used to implement the present invention is not electrically coupled in series to the circuit under test and, therefore, does not unnecessarily interfere with normal operation of the CMOS integrated circuit. The quiescent current, commonly referred to as $I_{DDQ}$, flows through the supply line of the CMOS integrated circuit between clock switching states. As current, both active and $I_{DDQ}$, flows through the supply line, a corresponding magnetic field is generated. The magnetic field flows around the axis of supply line in a circular path in accordance with the right hand rule. A magnetic field sensor is located on the substrate near supply line so as to sense any magnetic field generated by active or $I_{DDQ}$ current. An output from the magnetic field sensor is connected to output circuit located on the substrate which produces a measurement result. The output circuit is calibrated to indicate when the measured $I_{DDQ}$ exceeds a predetermined value to identify a potentially abnormal condition.

III. BRIEF DESCRIPTION OF THE DRAWINGS

FIG. 1 is an illustration of a CMOS inverter circuit with a gate-oxide short circuit having an abnormally high $I_{DDQ}$.

FIG. 5 is a diagram illustrating an embodiment of the present invention using a hall effect sensor.

FIG. 6 is a diagram illustrating the presently preferred embodiment of a magnetic field sensor of the present invention using a magnetotransistor circuit.

IV. DETAILED DESCRIPTION

A method and apparatus for measuring $I_{DDQ}$ a CMOS integrated circuit is described. In the following description, numerous specific details are set forth in order to provide a thorough understanding of the present invention. However, the present invention may be practiced without these specific details. In other instances, the details of well-known circuitry are not shown here in order not to obscure the present invention unnecessarily.

Figure 2:
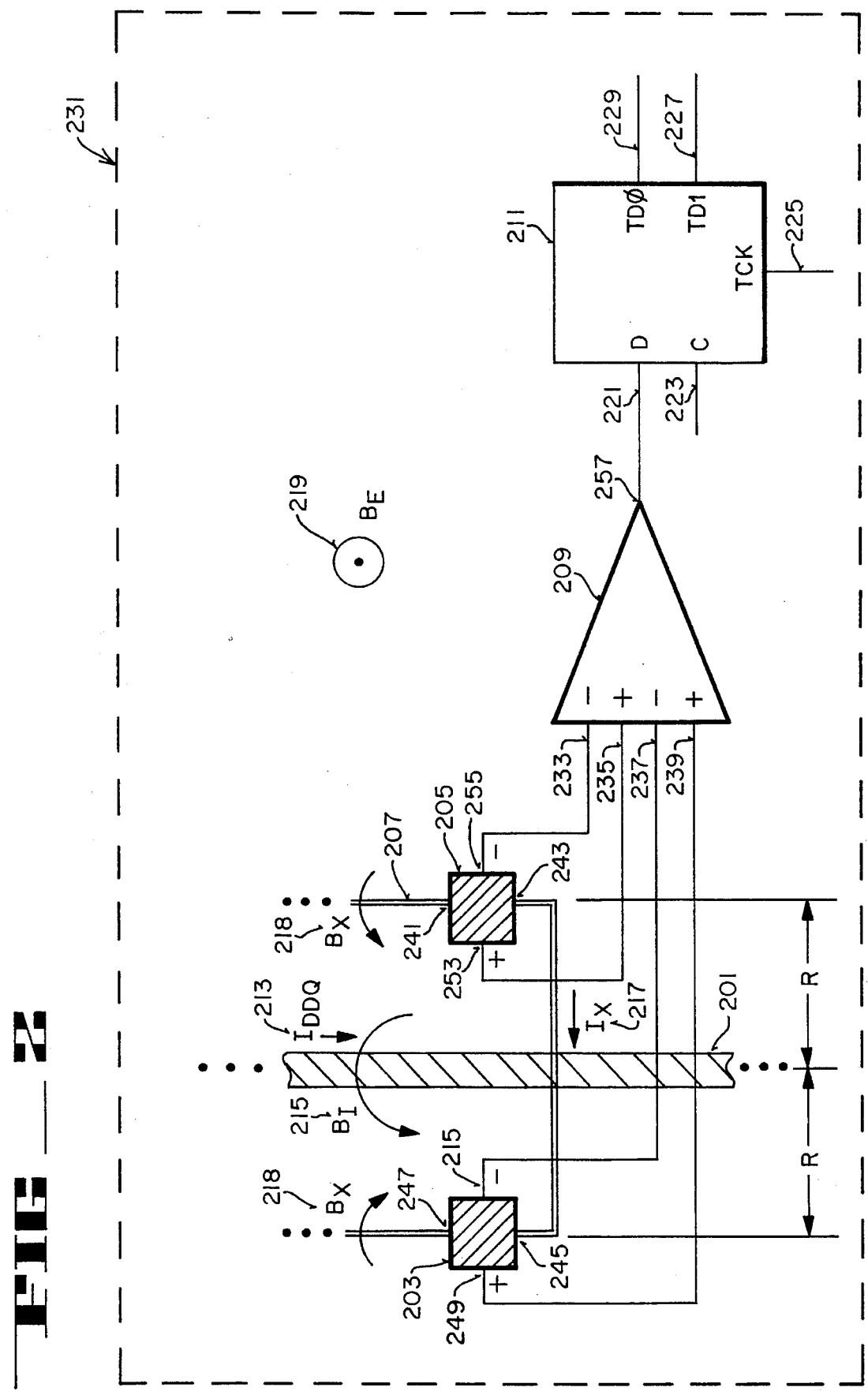
FIG. 2 is an illustration of the presently preferred embodiment measuring $I_{DDQ}$ by sensing the magnetic field with magnetic field sensors located and balanced on both sides of the supply line. This balanced sensor embodiment compensates for stray and the earth's magnetic fields.

FIG. 2 illustrates the present invention. While the CMOS integrated circuit is in a quiescent state, the quiescent current, $I_{DDQ}$ 213, is carried in supply line 201 which correspondingly generates magnetic field $B_I$ 215. $B_I$ 215 flows around supply line 201 in a circular direction in accordance with the right hand rule. Thus, the $B_I$ 215 flows in a clockwise direction around supply line 201 when looking down the line in the direction that $D_{DDQ}$ 213 flows. FIG. 2 also illustrates same a same direction magnetic field, $B_E$ 219, which may result from the earth's magnetic field or other stray magnetic fields generated from nearby electric currents. For the sake of example, $B_E$ 219 flows "out of the page" in FIG. 2. However, as will be apparent in the following discussion, proper operation of the present invention is independent of the direction that $B_E$ 219 flows.

The presently preferred embodiment utilizes substantially similar magnetic field sensors 203 and 205. Magnetic field sensors 203 and 205 are located in substrate 231 substantially near supply line 201 with an orientation such that supply line 201 is routed substantially midway between magnetic field sensors 203 and 205. Thus, sensors 203 and 205 are each positioned approximately equal distances R from supply line 201. Accordingly, magnetic field $B_I$ 215 flows through sensor 203 in one direction and magnetic field $B_I$ 215 flows through sensor 205 in substantially the opposite direction. Referring specifically to FIG. 2, $B_I$ 215 flows through sensor 203 in a direction going "into the page" and $B_I$ 215 flows through sensor 205 in a direction coming "out of the page."

Magnetic field sensors 203 and 205 of the presently preferred embodiment have differential output terminals 249 and 251, and 253 and 255 respectively. Sensors 203 and 205 each have a pair of taps 245 and 247, and 241 and 243 respectively. Sensor 203 is electrically coupled to sensor 205 in series through magnetic field sensor current line 207 such that magnetic field sensor current $I_X$ 217 flows through each sensor accordingly. Sensor 203 is connected to magnetic field sensor current line 207 through taps 245 and 247. Sensor 205 is connected to magnetic field sensor current line 207 through taps 241 and 243.

Since the same magnetic field sensor current, $I_X$ 217 flows through each sensor 203 and 205, and since each sensor 203 and 205 is located approximately equal distances R from supply line 201, the effects of magnetic field $B_I$ 215 are substantially equal on each sensor 203 and 205. The effects sensed by sensor 203 are output with differential outputs 249 and 251. The effects sensed by sensor 205 are output with differential outputs 253 and 255. The differential outputs 249 and 257 of sensor 203 are connected to output circuitry 209 at differential inputs 239 and 237, and the differential outputs 253 and 255 of sensor 205 are connected to output circuitry 209 at differential inputs 235 and 233.

Output circuitry 209 of the presently preferred embodiment is located on the substrate and sums the differential output pairs 249 and 251, and 253 and 255. Output circuitry 209 produces measurement results at sum output 257. In the presently preferred embodiment, the polarities of the differential output pairs of sensors 203 and 205 are coupled to output circuitry 209 in a manner such that the effects of magnetic field $B_I$ 215 are doubled by summing the differential output pairs. Moreover, the effects of the earth's magnetic field $B_E$ 219 are effectively canceled since $B_E$ 219 flows through both magnetic field sensors 203 and 205 and the same direction. In addition, the effects of the magnetic field $B_X$ 218 generated by $I_X$ 217 in 207 are canceled as $B_X$ 218 sum to zero.

Referring specifically to the illustration in FIG. 2, $B_I$ 215 flows, as stated previously, "into the page" through sensor 203 and "out of the page" through sensor 205 while $B_E$ 219 flows "out of the page" through both magnetic field sensors 203 and 205. Thus, by adding the effects of $B_I$ 215 on sensors 203 and 205, the effects of $B_E$ 219 are canceled since $B_E$ 219 flows in the opposite direction of $B_I$ 215 through sensor 205 in FIG. 2. Therefore, the presently preferred embodiment has increased immunity to the effects of same direction magnetic fields, such as those from the earth or stray fields generated from other electric currents.

The sum output 257 of output circuitry 209 of the present invention is connected to data collection circuitry 211. Data collection circuitry 211 is used in the presently preferred embodiment to collect and store a series of measurement results produced by output circuitry 209 over time, thus allowing subsequent examination of measurement results.

In the presently preferred embodiment, an IEEE P1149.1, or JTAG device, may be used to implement collection circuitry 211. In conformity with the IEEE P1149.1 standard, FIG. 2 shows sum output 257 of output circuitry 209 is connected to data input, D 221 of JTAG device 211. Clock input, C 223 of JTAG device 211 receives a clock signal. TCK input 225 of JTAG device 211 receives the test clock signal, TDI input 227 is the test data input which receives serial test patterns, and TDO output 229 is the test data output which allows test results to be read.

Figure 3:
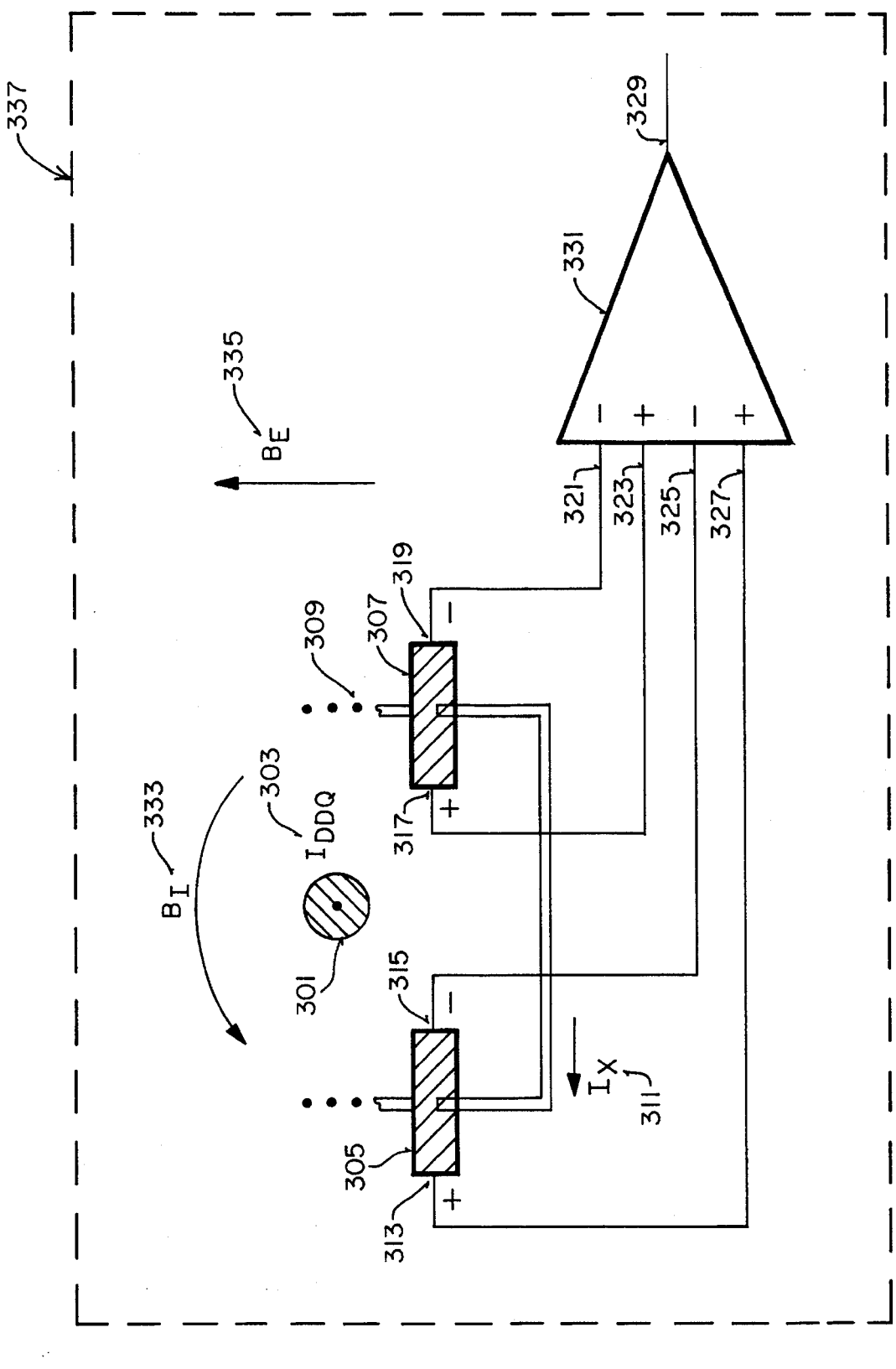
FIG. 3 is a cross sectional view of the present invention illustrating the magnetic field flowing around the supply line through the magnetic field sensors.

FIG. 3 illustrates a cross-sectional representation of the present invention. Magnetic field sensors 305 and 307 are shown in substrate 337 with supply line 301 substantially midway between sensors 305 and 307. Supply line 301 carries $I_{DDQ}$ 303 which, in FIG. 3, flows in a direction coming "out of the page."Correspondingly, magnetic field $B_I$ 333, which is generated from $I_{DDQ}$ 303, flows in a counter-clockwise direction around the axis of supply line 333 through magnetic field sensors 305 and 307. Sensors 305 and 307 are coupled in series through magnetic field sensor current line 309 with magnetic field sensor current $I_X$ 311 flowing through sensors 305 and 307 accordingly. Differential outputs 31 3 and 315 of magnetic field sensor 305 are coupled to differential inputs 325 and 327 of output circuitry 331. Differential outputs 317 and 319 of magnetic field sensor 307 are coupled to differential inputs 321 and 322 of output circuitry 331. Output circuit 331 of the presently preferred embodiment generates output 329 by summing the input signals received from magnetic field sensors 305 and 307.

It should be noted, as shown in FIG. 3, that it is not critical that supply 301 and magnetic field sensors 305 and 307 exist in the exact same plane in substrate 337. So long as sensors 305 and 307 are able to sense magnetic field $B_I$ 333, the effects of magnetic field $B_I$ 333 are substantially equal and opposite on sensors 305 and 307, and the effects of the earth's magnetic field $B_E$ 335 are substantially equal on both sensors 305 and 307, proper functionality of the present invention is realized.

Figure 4:
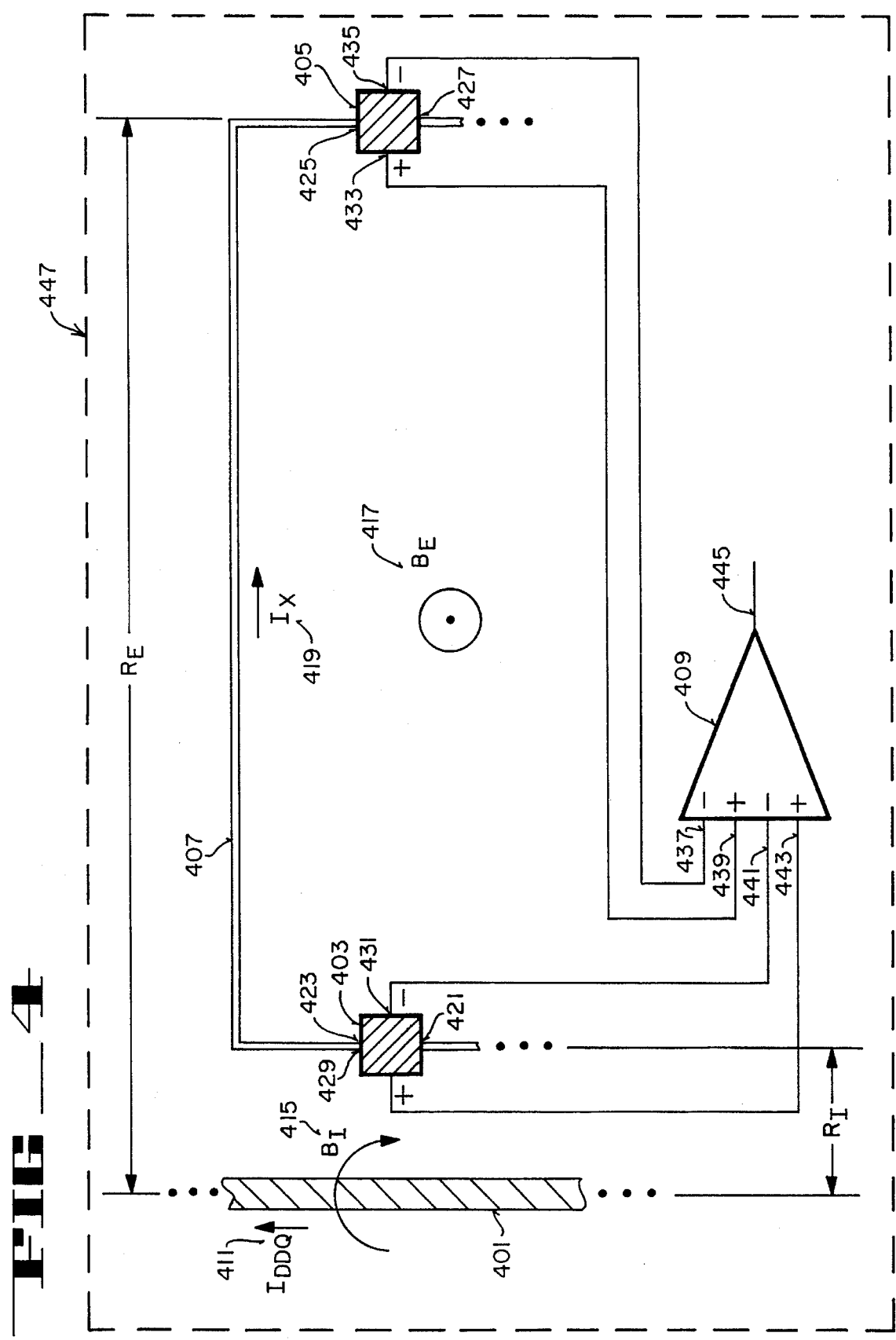
FIG. 4 is an illustration of an alternate embodiment of the present invention measuring $I_{DDQ}$ by sensing the magnetic field with a magnetic field sensor located near the supply line and a separate reference magnetic field sensor located a substantial distance from the supply line is used to account for stray and the earth's magnetic fields.

FIG. 4 illustrates an alternative embodiment of the present invention. Supply line 401 carries quiescent current $I_{DDQ}$ 411 which produces magnetic field $B_I$ 415. Magnetic field $B_I$ 415 flows around the axis of supply line 401 in accordance with the right hand rule. Magnetic field sensor 403 is located a relatively close distance $R_I$ on the substrate 447 near supply line 401 such that magnetic field $B_I$ 415 is sensed. Reference magnetic field sensor 405 is located a relatively great distance $R_E$ from supply line 401 such that any magnetic field effects realized in reference sensor 405 are not attributed to magnetic field $B_I$ 415. Instead, the magnetic field effects sensed by reference sensor 405 can be primarily attributed to the earth's magnetic field $B_E$ 417, or other same direction magnetic fields generated by other nearby electric currents.

Magnetic field sensor 403 and reference sensor 405 are coupled in series through magnetic field sensor current line 407 such that magnetic field sensor current $I_X$ 419 flows through magnetic field sensor 403 and reference sensor 405. Sensor 403 is coupled to magnetic field sensor current line 407 through taps 421 and 423. Reference sensor 405 is coupled to magnetic field sensor current line 407 through taps 425 and 427. Accordingly, magnetic field sensor current $I_X$ 419 flows through sensors 403 and 405 between taps 421 and 423, and 425 and 427 respectively.

Magnetic field sensor 403 generates differential output pair 429 and 431 and reference sensor 405 generates differential output pair 433 and 435. Differential output pair 429 and 431 are coupled to output circuitry 409 at differential input pair 441 and 443. Differential output pair 433 and 435 are coupled to output circuitry 409 at differential inputs 437 and 439. Output circuitry 409 reads the outputs from both sensor 403 and reference sensor 405, takes the difference between the two sensors, and outputs a measurement result at output 445. Since sensor 403 experiences the effects of magnetic fields $B_I$ 415 and $B_E$ 417, and reference sensor 405 experiences the effects of only $B_E$ 417, the difference between the outputs of sensor 403 and reference sensor 405 results in a measurement of magnetic field $B_I$ 415 without the effects of magnetic field $B_E$ 417.

Referring back to FIG. 2, a variety of types of magnetic field sensors can be used to implement sensors 203 and 205 of the present invention. For example, magnetic field sensors 203 and 205 could be realized with simple Hall effect sensors as regions of p-doped silicon near supply line 201. Assume magnetic field sensor current $I_X$ 217 flows through sensors 205 in the same direction and parallel with $I_{DDQ}$ 213 as shown in FIG. 2. $I_X$ 217 further flows through sensor 203 in the opposite direction and parallel with $I_{DDQ}$ 213. AS described previously, $I_{DDQ}$ 213 generates magnetic field $B_I$ 215 which flows around the axis of supply line 201. Thus, referring to FIG. 2, magnetic field $B_I$ 215 flows through sensor 203 in a direction going "through the page," and through sensor 205 in a direction coming "out of the page."

In accordance with the Hall effect, a potential difference, or Hall voltage, will be generated between the respective differential output terminals 249, 251, 253, and 255 of each sensor 203 and 205. By measuring the voltages between the differential output terminal pairs 249 and 251, and 253 and 255, $I_{DDQ}$ can be determined by using the Hall effect, the Lorentz force equation, and Ampere's law.

Magnetic field $B_I$ 215, created from $I_{DDQ}$ 213, can be determined using the following derivative of Ampere's law:

$$B_I = \frac{\mu_0 I_{DDQ}}{2\pi R} \quad \text{(Equation 1)}$$

where $B_1$ 215 is the magnetic field in tesla or webers per square meter, $\mu_o$ is the permeability constant which is $4\pi \times 10^{-7}$ tesla.meters/amps, $I_{DDQ}$ 213 is the current in amps, and R is the distance in meters of sensor 203 or sensor 205 from the axis of the wire.

Using the Hall effect, the voltage between the differential output pair 249 and 251 can be determined. For the sake of example, assume magnetic field sensor 503 in FIG. 5 corresponds with magnetic field sensor 203 in FIG. 2. Magnetic field $B_I$ 515 is flowing "into the page" in a direction perpendicular to the direction of magnetic field sensor current $I_X$ 517. $I_X$ 517 is carried by magnetic field sensor current line 507 and flows through sensor 503 from tap 545 to tap 547. If it is further assumed in this example that sensor 503 is comprised of p-doped silicon, and that $I_X$ 517, therefore consists of the flow of positive charges, or "holes." In response to magnetic field $B_I$ 515, the positive charges of $I_X$ 517 will drift toward differential output 549 and away from differential output 551. The charge carriers of $I_X$ 517 drift as a result of the forces exerted on the charge carriers by magnetic field $B_I$ 515 in accordance with the Lorentz force equation, where $F=qV \times B$. As a result, a potential difference between differential output 549 and 551 is generated. This potential difference, or hall voltage $V_H$, can be determined using the following Hall effect relationship:

$$V_H = \frac{I_S B_I}{n q_o h} \quad \text{(Equation 2)}$$

where $I_X$ 517 is current in amps, $B_I$ 515 is magnetic field in teslas or webers per square meter, n is the density of charge carriers per cubic meter in the doped silicon, $q_o$ is the value of an electronic charge which is $1.602 \times 10^{-19}$ coulombs, and h is the width of the doped silicon of magnetic field sensor 503 in meters. In should be noted that by "lightly doping" the silicon (smaller n value), a greater $V_H$ is produced, and therefore, an increased sensitivity to magnetic field $B_I$ is realized.

As shown further in the example of FIG. 5, differential output pair 549 and 551 are coupled to output circuitry 509 at differential input pair 537 and 539. Output circuitry 509 senses the $V_H$, and is therefore able to make a determination of $I_{DDQ}$ based on the measured voltage using the above described relationships.

Referring now to FIG. 6, magnetic field sensor 603 of the presently preferred embodiment is illustrated. Magnetic field sensor 603 is comprised of a magnetotransistor circuit and corresponds with magnetic field sensor 203 of FIG. 2. Magnetic field sensor current $I_X$ 617 is carried by magnetic field sensor current line 607 and flows through magnetic field sensor 603 from well tap 645 to well tap 647. Magnetic field $B_I$ 615 flows "into the page." Differential output pair 649 and 651 is output by magnetic field sensor 603 and is coupled to output circuit 609 at differential input pair 637 and 639.

Magnetic field sensor 603 of the presently preferred embodiment is a magnetotransistor current mirror circuit comprised of two p-channel transistor devices 659 and 661 which share a common n-well 663, or bulk. If n-channel transistors are used, the transistors would share a common p-well. Correspondingly, $I_X$ 617 flows through the well 663 between the two well taps 645 and 647.

As shown in FIG. 6, transistor 659 and 661 sources 675 and 679 are commonly coupled to $V_{CC}$ and transistor 659 and 661 drains 681 and 683 are coupled to ground through loads 665 and 667. Transistor 659 and 661 gates 673 and 677 are coupled together at drain 681 to form the current mirror circuit.

In the presently preferred embodiment, transistors 659 and 661 are fabricated in well 663 such that the drains 681 and 683 are located on opposite sides of the common sources 675 and 679. Accordingly, $I_X$ 617 current flows equally through drains 681 and 683 in the absence of any magnetic field $B_I$ 615.

In the presently preferred embodiment, the magnetotransistor circuit is biased near the threshold of conduction, or $V_T$.

Thus, the current mirror circuit consisting of transistors 659 and 661 exhibits increased gain, or sensitivity to moderations in the drain-source voltage of each respective transistor. The drain-source voltage of transistor 659 is the voltage difference between drain 681 and source 675. The drain-source voltage of transistor 661 is the voltage difference between drain 683 and source 679.

To illustrate, assume similar conditions for FIG. 6 as those described in FIG. 5. If there is no magnetic field $B_I$ 615, bias current $I_{B1}$ 669 is substantially equal to bias current $I_{B2}$ 672. As a result, the voltage difference between output pair 649 and 651 is approximately zero. However, when a magnetic field $B_I$ 615 of sufficient magnitude exists, Lorentz forces acting on the charge carriers of magnetic field sensor current $I_X$ 617 will push the charge carriers in the direction towards one of the drains 681 and 683 and away from the other. Restated, the hall voltage which is generated has opposite effects on transistors 659 and 661. As a result, a difference develops between the drain-source voltages of transistors 659 and 661. Correspondingly, a current difference between $I_{B1}$ and $I_{B2}$ will result. Hence, a differential voltage will be realized at outputs 649 and 651. This differential voltage at outputs 649 and 651 may then be sensed and amplified by output circuit 609 accordingly.

In effect, the hall voltage generated by magnetic field modulates the threshold of conduction, or $V_T$, of each transistor thereby modulating the respective bias currents $I_{B1}$ 669 and $I_{B2}$ 671. The generated hall voltage backgates each transistor and shifts the $V_T$ of each of the transistors 659 and 661 in opposite directions.

The magnetotransistor circuit of the presently preferred embodiment is particularly useful because of its exceptional sensitivity to magnetic field disturbances. By biasing the magnetotransistor circuit for subthreshold conduction with zero magnetic field, current is expected to vary by one decade for every 60 to 100 mV of change in $V_{GS}$. In addition, all of the described embodiments of the present invention measure $I_{DDQ}$ without the detrimental effects of inserting invasive series resistances into the circuits under test.

Thus, a non-invasive method for measuring the electric current flowing in a integrated circuit has been described. Although the present invention has been described in terms of a preferred embodiment, it will be appreciated that various modifications and alterations might be made by those skilled in the art without departing from the spirit and scope of the present invention.

We claim:

1. A method for measuring a quiescent current flowing through a supply line in the CMOS integrated circuit on a substrate, the CMOS integrated circuit switching clock states periodically, the quiescent current flowing through the supply line between clock switching states, the quiescent current producing a first magnetic field flowing in a circular path relative to the axis of the supply line, the method comprising the steps of:

locating a first magnetic field sensor on the substrate near the supply line such that the first magnetic field flows through the first magnetic field sensor, the first magnetic field sensor generating a first output in response to the first magnetic field;

coupling the first output to an output circuit on the substrate so as to measure the strength of the first magnetic field, the output circuit generating a measurement result; and calibrating the output circuit such that the measurement result indicates when the first magnetic field produced by the quiescent current has a predetermined value.

2. The method defined in claim 1 wherein the first magnetic field sensor has a first tap and a second tap, the first magnetic field sensor having a sensor current flowing between the first and second taps.

3. The method defined in claim 2 including an additional step of coupling a second magnetic field sensor to the first magnetic field sensor, the second magnetic field sensor having a third tap and a fourth tap, the sensor current flowing between the third and fourth taps, the second magnetic field sensor generating a second output in response to the first magnetic field.

4. The method defined in claim 3 including an additional step of locating a second magnetic field sensor on the substrate next to the supply line such that the first magnetic field flows through the second magnetic field sensor, the second magnetic field sensor located such that the supply line is routed substantially midway between the first and second magnetic field sensors.

5. The method defined in claim 4 wherein the second magnetic field sensor is located on the substrate such that the first magnetic field flows through the first magnetic field sensor in a first direction and the first magnetic field flows through the second magnetic field in a second direction, the first direction being substantially opposite to the second direction.

6. The method defined in claim 5 wherein a second magnetic field flows through the first and second magnetic field sensors in a third direction, the second magnetic field generating a first effect in the first magnetic field sensor and a second effect in the second magnetic field sensor.

7. The method defined in claim 6 including an additional step of coupling the second output to the output circuit such that the output circuit sums the first and second outputs such that the first and second effects are substantially canceled in the measurement result.

8. The method defined in claim 7 wherein a plurality of successive measurement results are generated over time by the output circuit.

9. The method defined in claim 8 including an additional step of collecting the plurality of measurement results with a collection circuit so as to store the plurality of measurement results for subsequent examination.

10. The method defined in claim 9 wherein the first output comprises a first differential output and a second differential output, the first output determined by a potential difference between the first differential output and the second differential output.

11. The method defined in claim 10 wherein the first magnetic field sensor comprises a magnetotransistor circuit, the magnetotransistor circuit biased such that the potential difference between the first differential output and the second differential output indicates the strength of the first magnetic field.

12. The method defined in claim 11 wherein the first magnetic field sensor comprises a hall effect sensor, the hall effect sensor producing the potential difference between the first differential output and the second differential output indicating the strength of the first magnetic field.

13. A circuit for measuring a quiescent current flowing through a supply line in the CMOS integrated circuit on a substrate, the CMOS integrated circuit switching clock states periodically, the quiescent current flowing through the supply line between clock switching states, the quiescent current producing a first magnetic field flowing in a circular path relative to the axis of the supply line, the circuit comprising:

a first magnetic field sensor on the substrate near the supply line such that the first magnetic field flows through the first magnetic field sensor, the first magnetic field sensor generating a first output in response to the first magnetic field; and an output circuit on the substrate coupled to the first output, the output circuit generating a measurement result in response to the strength of the first magnetic field, the measurement result indicating when the first magnetic field produced by the quiescent current has a predetermined value.

14. The circuit defined in claim 13 wherein the first magnetic field sensor has a first tap and a second tap, the first magnetic field sensor having a sensor current flowing between the first and second taps.

15. The circuit defined in claim 14 wherein a second magnetic field sensor is coupled to the first magnetic field sensor, the second magnetic field sensor having a third tap and a fourth tap such that the sensor current flows between the third and fourth taps, the second magnetic field sensor generating a second output in response to the first magnetic field.

16. The circuit defined in claim 15 wherein the second magnetic field sensor is located on the substrate next to the supply line such that the first magnetic field flows through the second magnetic field sensor, the second magnetic field sensor located on the substrate such that the supply line is routed substantially midway between the first and second magnetic field sensors.

17. The circuit defined in claim 16 wherein the second magnetic field sensor is located on the substrate such that the first magnetic field flows through the first magnetic field sensor in a first direction and the first magnetic field flows through the second magnetic field in a second direction, the first direction being substantially opposite to the second direction.

18. The circuit defined in claim 17 wherein a second magnetic field flows through the first and second magnetic field sensors in a third direction, the second magnetic field generating a first effect in the first magnetic field sensor and a second effect in the second magnetic field sensor.

19. The circuit defined in claim 18 wherein the second output is coupled to the output circuit such that the output circuit sums the first and second outputs such that the first and second effects are substantially canceled in the measurement result.

20. The circuit defined in claim 18 wherein the output circuit generates a plurality of successive measurement results over time.

21. The circuit defined in claim 19 wherein a collection circuit is coupled to the output circuit so as to store the plurality of measurement results with a collection circuit for subsequent examination.

22. The circuit defined in claim 21 wherein the first output comprises a first differential output and a second differential output, the first output determined by a potential difference between the first differential output and the second differential output.

23. The circuit defined in claim 22 wherein the first magnetic field sensor comprises a magnetotransistor circuit, the magnetotransistor circuit biased such that the potential difference between the first differential output and the second differential output indicates the strength of the first magnetic field.

24. The circuit defined in claim 23 wherein the magnetotransistor circuit is comprised of a current mirror.

25. The circuit defined in claim 24 wherein the magnetotransistor circuit comprises a first transistor and a second transistor, the first and second transistors sharing a common well, the drain of the first transistor coupled to a first potential through a first load, the gate of the first transistor coupled to the drain of the first transistor, the source of the first transistor coupled to a second potential, the drain of the second transistor coupled to the first potential through a second load, the gate of the second transistor coupled to the drain of the first transistor, the source of the second transistor coupled to the second potential.

26. The circuit defined in claim 25 wherein the first differential output is the drain of the first transistor and the second differential output is the drain of the second transistor.

27. The circuit defined in claim 26 wherein the common well includes a first well tap and a second well tap such that the sensor current flows between the first and second well taps, the sensor current generating a first potential difference at the gate of the first transistor in response to the first magnetic field, the sensor current generating a second potential difference at the gate of the second transistor in response to the first magnetic field.

28. The circuit defined in claim 22 wherein the first magnetic field sensor comprises a hall effect sensor, the hall effect sensor producing the potential difference between the first differential output and the second differential output indicating the strength of the first magnetic field.

* * * * *